United States Patent
Yuyama et al.

(10) Patent No.: US 10,816,588 B2
(45) Date of Patent: Oct. 27, 2020

(54) NOISE SOURCE MONITORING APPARATUS AND NOISE SOURCE MONITORING METHOD

(71) Applicant: FANUC CORPORATION, Yamanashi (JP)

(72) Inventors: Makine Yuyama, Yamanashi-ken (JP); Tetsuro Matsudaira, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/504,605

(22) Filed: Jul. 8, 2019

(65) Prior Publication Data

US 2020/0018785 A1     Jan. 16, 2020

(30) Foreign Application Priority Data

Jul. 12, 2018  (JP) ................................ 2018-132433
May 8, 2019   (JP) ................................ 2019-088492

(51) Int. Cl.
| | |
|---|---|
| G01R 29/26 | (2006.01) |
| G06T 7/00  | (2017.01) |
| H04N 5/445 | (2011.01) |
| G01R 13/02 | (2006.01) |
| G05B 19/406 | (2006.01) |

(52) U.S. Cl.
CPC ......... *G01R 29/26* (2013.01); *G01R 13/0218* (2013.01); *G05B 19/406* (2013.01); *G06T 7/0004* (2013.01); *H04N 5/445* (2013.01); *G05B 2219/49105* (2013.01); *G06T 2207/30164* (2013.01)

(58) Field of Classification Search
CPC .. G01R 29/26; G01R 13/0218; G06T 7/0004; G06T 2207/30164; H04N 5/445; G05B 19/406; G05B 2219/49105; G05B 2219/37501; G05B 2219/37337; B25J 9/1674
USPC .......................................................... 348/86
See application file for complete search history.

(56) References Cited

FOREIGN PATENT DOCUMENTS

| | | |
|---|---|---|
| JP | 2000276222 A | 10/2000 |
| JP | 2004005639 A | 1/2004 |
| JP | 2007183171 A | 7/2007 |
| JP | 2008165453 A | 7/2008 |
| JP | 2013117812 A | 6/2013 |

*Primary Examiner* — Marnie A Matt
(74) *Attorney, Agent, or Firm* — Robert P. Michal, Esq.; Carter, DeLuca & Farrell LLP (57) ABSTRACT

A noise source monitoring apparatus includes: an imaging unit for capturing an image of multiple switch units; an event time acquisition unit for acquiring a noise event time of a noise occurring in a control device; a switching time recognition unit for recognizing an on/off switching time of each of the multiple switch units; a correlation calculation unit for calculating, for every switch unit, the degree of correlation between occurrence of the noise and the on/off switching of the switch unit; and a display control unit for causing a display unit to display information indicating the degree of correlation for every switch unit.

16 Claims, 9 Drawing Sheets

|  | 1ST SWITCH UNIT | 2ND SWITCH UNIT | 3RD SWITCH UNIT | 4TH SWITCH UNIT | 5TH SWITCH UNIT |
|---|---|---|---|---|---|
| 1ST TIME PERIOD | NONE | NONE | NONE | NONE | NONE |
| 2ND TIME PERIOD | NONE | PRESENT | NONE | NONE | NONE |
| 3RD TIME PERIOD | NONE | NONE | NONE | NONE | PRESENT |
| 4TH TIME PERIOD | NONE | PRESENT | NONE | NONE | NONE |
| 5TH TIME PERIOD | NONE | NONE | NONE | NONE | PRESENT |
| 6TH TIME PERIOD | PRESENT | NONE | NONE | NONE | NONE |
| 7TH TIME PERIOD | NONE | NONE | NONE | NONE | PRESENT |
| 8TH TIME PERIOD | NONE | NONE | NONE | NONE | PRESENT |
| 9TH TIME PERIOD | NONE | PRESENT | NONE | NONE | NONE |
| 10TH TIME PERIOD | NONE | NONE | NONE | NONE | PRESENT |

NOISE SOURCE MONITORING APPARATUS AND NOISE SOURCE MONITORING METHOD

CROSS-REFERENCE TO RELATED APPLICATION

This application is based upon and claims the benefit of priority from Japanese Patent Applications No. 2018-132433 filed on Jul. 12, 2018 and No. 2019-088492 filed on May 8, 2019, the contents of which are incorporated herein by reference.

BACKGROUND OF THE INVENTION

Field of the Invention

The present invention relates to a noise source monitoring apparatus and a noise source monitoring method for monitoring noise sources of noise generated in a control device that controls an industrial machine.

Description of the Related Art

Japanese Laid-Open Patent Publication No. 2000-276222 discloses a logging device which images the operation state of a monitoring target facility (manufacturing line, manufacturing equipment, etc.) with a camera to record the captured image data and display the recorded result on a display.

SUMMARY OF THE INVENTION

Incidentally, due to the operation of the above-mentioned monitoring target facility, noise may be emitted from at least one part of the facility and transmitted to, and generated in, a control device that controls industrial machines around the monitoring target facility.

However, the logging device disclosed in Japanese Laid-Open Patent Publication No. 2000-276222 has a problem that it cannot offer the operator any information for estimating the noise source of the noise generated in the control device.

It is therefore an object of the present invention to provide a noise source monitoring apparatus and a noise source monitoring method that provide an operator with information for estimating a noise source of noise generated in a control device for controlling an industrial machine.

According to a first aspect of the present invention, a noise source monitoring apparatus includes: an imaging unit configured to capture an image of a plurality of switch units configured to switch on and off drive units for driving a plurality of devices, the drive units being arranged around a control device for controlling an industrial machine, the plurality of devices being different from the industrial machine; an event time acquisition unit configured to acquire a noise event time of a noise occurring in the control device; a switching time recognition unit configured to recognize an on/off switching time of each of the plurality of switch units, based on the image captured by the imaging unit; a correlation calculation unit configured to calculate, for each of the switch units, the degree of correlation between occurrence of the noise event and the on/off switching of the switch unit, based on the noise event time and the on/off switching time of each of the plurality of switch units; and a display control unit configured to cause a display unit to display information indicating the degree of correlation for each of the switch units.

According to a second aspect of the present invention, a noise source monitoring method includes: an imaging step of capturing an image of a plurality of switch units configured to switch on and off drive units for driving a plurality of devices, the drive units being arranged around a control device for controlling an industrial machine, the plurality of devices being different from the industrial machine; an event time acquiring step of acquiring a noise event time of a noise occurring in the control device; a switching time recognizing step of recognizing an on/off switching time of each of the plurality of switch units, based on the image captured at the imaging step; a correlation calculating step of calculating, for each of the switch units, the degree of correlation between occurrence of the noise and the on/off switching of the switch unit, based on the noise event time and the on/off switching time of each of the plurality of switch units; and a display controlling step of causing a display unit to display information indicating the degree of correlation for each of the switch units.

According to the present invention, it is possible to provide the operator with information for estimating a noise source of noise generated in a control device for controlling an industrial machine.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The noise source monitoring apparatus and the noise source monitoring method according to the present invention will be detailed by describing preferred embodiments with reference to the accompanying drawings.

Embodiment

Figure 1:
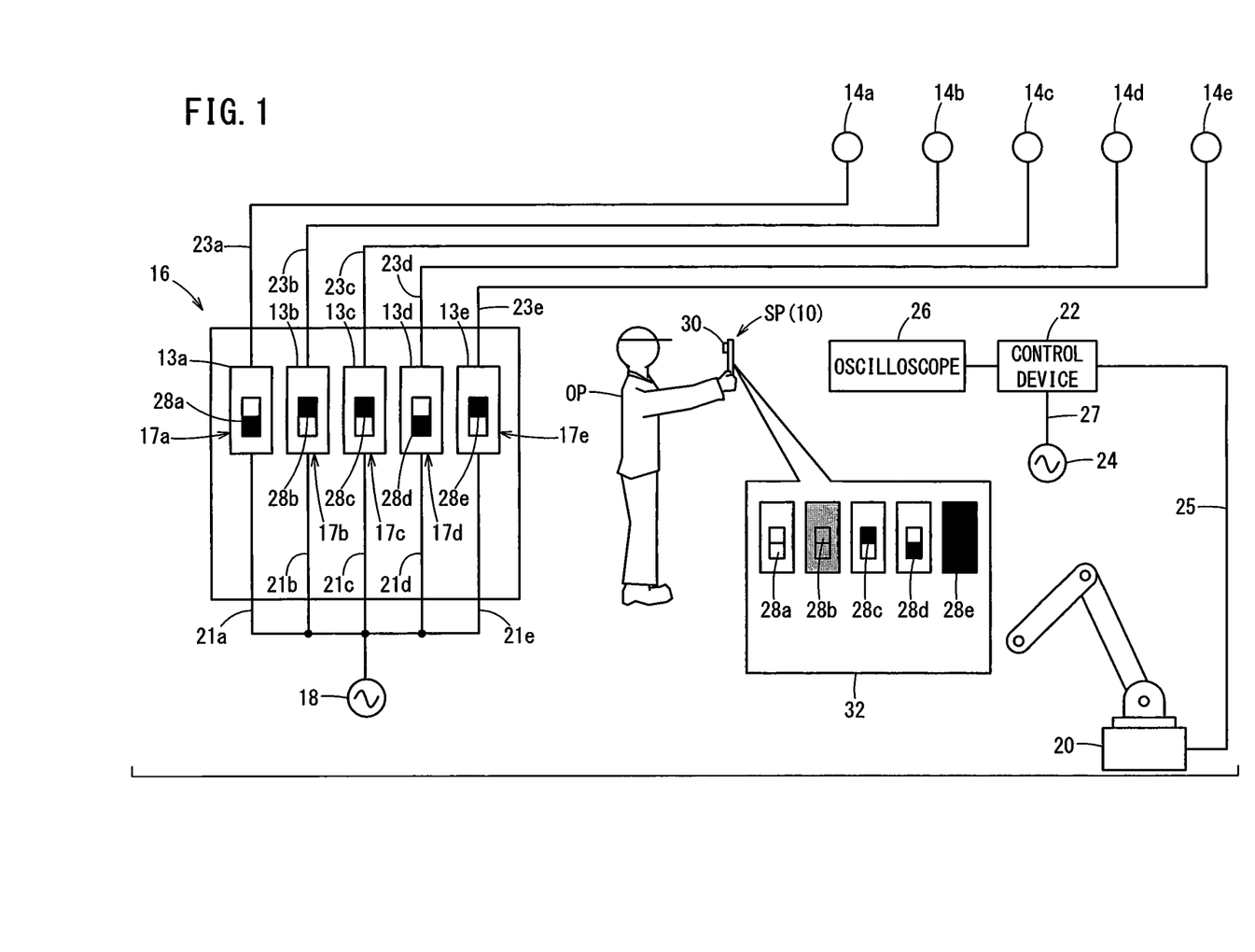
FIG. 1 is a diagram showing a schematic configuration of a noise source monitoring apparatus and others according to an embodiment of the present invention.

FIG. 1 shows a schematic configuration of a noise source monitoring apparatus 10 and others, which is an example of the noise source monitoring apparatus of the present invention.

The noise source monitoring apparatus 10 is a device that monitors noise sources which generate noise in a control device 22 for controlling an industrial machine or a robot 20. Details of the noise source monitoring apparatus 10 will be described later.

There are arranged multiple (for example, five) drive units 14 (first drive unit 14a, second drive unit 14b, third drive unit 14c, fourth drive unit 14d, fifth drive unit 14e) around the robot 20 and the control device 22. Each drive unit 14 is a drive source for an apparatus, such as a conveyor, for example. Each drive unit 14 is connected to a first power supply 18 via a switchboard 16, as needed. Each drive unit 14 may be a motor, a solenoid or the like, in which for example, a coil is incorporated.

The switchboard 16 includes a plurality of (for example, five) switch units 17 that correspond to a plurality of (for example, five) drive units 14, respectively, and each switch connection/disconnection between the corresponding drive unit 14 and the first power supply 18. Here, the switch unit 17 corresponding to the first drive unit 14a is referred to as a first switch unit 17a, the switch unit 17 corresponding to the second drive unit 14b is referred to as a second switch unit 17b, the switch unit 17 corresponding to the third drive unit 14c is referred to as a third switch unit 17c, the switch unit 17 corresponding to the fourth drive unit 14d is referred to as a fourth switch unit 17d, and the switch unit 17 corresponding to the fifth drive unit 14e is referred to as a fifth switch unit 17e.

Each switch unit 17 includes a casing 13, a switch such as a relay, a contactor or the like, housed in the casing 13, and a lever 28 arranged inside a cutout formed on the front wall (the wall on the front in FIG. 1) of the casing 13. The switch has a fixed contact and a moving contact that moves by magnetic force of an electromagnet. The lever 28 moves up and down in the cutout in conjunction with the movement of the moving contact. Here, in the drawing of FIG. 1, the black part in the cutout of each switch unit 17 shows the lever 28. When the lever 28 of each switch unit 17 is located at the upper position in the cutout, the switch corresponding to the lever 28 is on. When the lever 28 of each switch unit 17 is located at the lower position in the cutout, the switch corresponding to the lever 28 is off.

Here, the casing 13 of the first switch unit 17a is named a first casing 13a, the casing 13 of the second switch unit 17b is named a second casing 13b, the casing 13 of the third switch unit 17c is named a third casing 13c, the casing 13 of the fourth switch unit 17d is named a fourth casing 13d, and the casing 13 of the fifth switch unit 17e is named a fifth casing 13e. The switch of the first switch unit 17a is called a first switch, the switch of the second switch unit 17b is called a second switch, the switch of the third switch unit 17c is called a third switch, the switch of the fourth switch unit 17d is called a fourth switch, and the switch of the fifth switch unit 17e is called a fifth switch. The lever 28 of the first switch unit 17a is called a first lever 28a, the lever 28 of the second switch unit 17b is called a second lever 28b, and the lever 28 of the third switch unit 17c is called a third lever 28c, the lever 28 of the fourth switch unit 17d is called a fourth lever 28d, and the lever 28 of the fifth switch unit 17e is called a fifth lever 28e.

One of the fixed and moving contacts in each switch is connected to the first power supply 18 via a power cable 21, and the other is connected to the drive unit 14 via a drive cable 23. Detailedly, one of the fixed and moving contacts of the first switch is connected to the first power supply 18 via a first power cable 21a, and the other is connected to the first drive unit 14a via a first drive cable 23a. One of the fixed and moving contacts of the second switch is connected to the first power supply 18 via a second power cable 21b, and the other is connected to the second drive unit 14b via a second drive cable 23b. One of the fixed and moving contacts of the third switch is connected to the first power supply 18 via a third power cable 21c, and the other is connected to the third drive unit 14c via a third drive cable 23c. One of the fixed and moving contacts of the fourth switch is connected to the first power supply 18 via a fourth power cable 21d, and the other is connected to the fourth drive unit 14d via a fourth drive cable 23d. One of the fixed and moving contacts of the fifth switch is connected to the first power supply 18 via a fifth power cable 21e, and the other is connected to the fifth drive unit 14e via a fifth drive cable 23e.

When each switch unit 17 is off, the drive unit 14 corresponding to the switch unit 17 and the first power supply 18 are disconnected. When each switch unit 17 is turned on from the off state, the drive unit 14 corresponding to the switch unit 17 and the first power supply 18 are brought into conduction.

The timing at which each switch unit 17 is turned on and off is determined in advance based on a control program for operating the multiple drive units 14. For example, each switch unit 17 is driven by a PLC (Programmable Logic Controller).

The robot 20 is an industrial robot having multiple movable joints driven by, for example, motors, and is connected to the control device 22 via a control cable 25.

The control device 22 is connected to a second power supply 24 (AC power supply) via a power supply cable 27. The control device 22 includes: a signal generating circuit for generating a control signal in accordance with the control program for operating the robot 20; an unillustrated converter for converting AC current (alternating electric current) from the second power supply 24 into DC current (direct electric current); and a current output circuit that outputs the DC current from the converter, to the motors of the robot 20 at timings according to the control signal. The control device 22 is realized by, for example, a CPU (Central Processing Unit) or a FPGA (Field Programmable Gate Array).

An oscilloscope 26 is connected to the control device 22, observes the voltage waveform of the control signal, and displays the observation result (voltage waveform) on the screen.

Here, as a connection state (i.e., connecting or disconnecting) between the first power supply 18 and the n-th drive unit 14 (n=1 to 5) changes in accordance with ON or OFF of the n-th switch unit 17 (n=1 to 5), there may occur a case in which a radiation noise arises from at least one of the n-th switch unit 17, the n-th drive unit 14, the n-th drive cable 23 (n=1 to 5) connecting the n-th switch unit 17 and the n-th drive unit 14, and the n-th power cable 21 (n=1 to 5) connecting the n-th switch unit 17 and the first power supply 18. For example, when the n-th switch unit 17 is turned off from the on-state, the surplus energy stored in the coil of the n-th drive unit 14 corresponding to the switch unit 17 has nowhere to go, so that radiation noise is liable to arise. If this radiation noise is transmitted to the control device 22, the waveform of the control signal is disturbed, and the normal operation of the robot 20 is hindered.

To deal with this, the control device 22 monitors the waveform of the generated control signal, and if it determines that the waveform of the control signal is disturbed and that the control signal is corrupted by radiation noise so that the normal operation is hindered, the control device decides that there is an error and stops the operation of the robot 20. Not to mention, there may be a case where a noise (e.g., conduction noise) other than radiation noise is mixed into the control signal, but here, the "radiation noise" will be focused on and described. Now, an electrical system including the first switch unit 17a, the first drive unit 14a and the first power supply 18 is referred to as a first electrical system. An electric system including the second switch unit 17b, the second drive unit 14b and the first power supply 18 is named a second electric system. An electric system including the third switch unit 17c, the third drive unit 14c and the first power supply 18 is named a third electric system. An electric system including the fourth switch unit 17d, the fourth drive unit 14d and the first power supply 18 is named a fourth electric system. An electric system including the fifth switch unit 17e, the fifth drive unit 14e and the first power supply 18 is named a fifth electric system.

In order to resume the operation of the robot 20 which has been stopped, an operator OP needs to estimate which of the first to fifth electrical systems the radiation noise source (noise source) is derived from, and take measures to suppress the radiation of the radiation noise (for example, by setting an electromagnetic shield) or to reduce the influence of the radiation noise (for example, by changing the routing of cables, i.e., the control cable 25, at least one drive cable 23, at least one power cable 21 etc.), with respect to the estimated electrical system.

For dealing with the above situation, the inventors of the present invention have developed the noise source monitoring apparatus 10 of the present embodiment in order to enable the operator OP to estimate the generation source of radiation noise.

Figure 2:
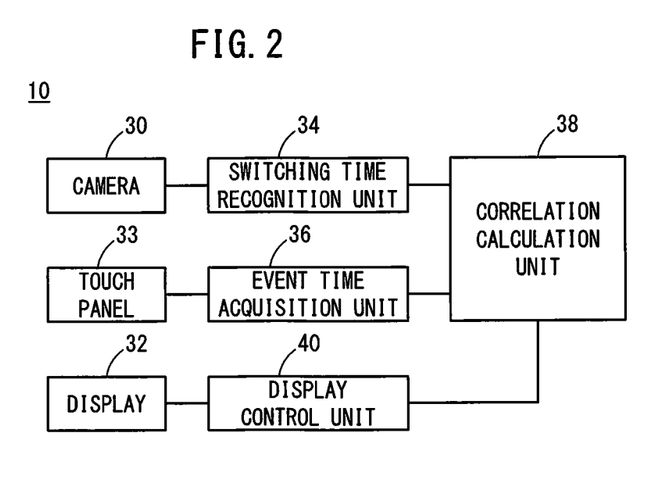
FIG. 2 is a control block diagram of a noise source monitoring apparatus according to an embodiment of the present invention.

The noise source monitoring apparatus 10 can be realized by, for example, a smartphone SP as shown in FIG. 1. As an example, as shown in FIG. 2, the noise source monitoring apparatus 10 includes a camera 30 (imaging unit), a display 32 (display unit), a touch panel 33 (input unit), a switching time recognition unit 34, an event time acquisition unit 36, a correlation calculation unit 38 and a display control unit 40. Here, the camera 30 and the display 32 are those provided as standard on the smartphone SP. The switching time recognition unit 34, the event time acquisition unit 36, the correlation calculation unit 38 and the display control unit 40 are implemented by a computer containing, for example, a central processing unit (CPU), which is incorporated in the smartphone SP. Here, when the operator OP activates the "noise source monitoring mode" which is one of the applications of the noise source monitoring apparatus 10 (smart phone SP), the noise source monitoring apparatus 10 starts operation.

The noise source monitoring apparatus 10 is held by the operator OP so that the camera 30 can capture the operation state of the multiple levers 28 on the switchboard 16, that is, the operation state of the multiple switch units 17. The noise source monitoring apparatus 10 may be held not by the operator OP but supported by a holding tool such as a stand or a tripod. When the door of the box housing the switchboard 16 is not transparent, the operator OP may open the door to expose the multiple switch units 17 so that the camera 30 can image the operation state of the multiple switch units 17. When the door of the box housing the switchboard 16 is transparent, the operator OP can image the operation state of the multiple switch units 17 by the camera 30 while keeping the door closed.

When the operator OP holds the noise source monitoring apparatus 10 so that the multiple levers 28 come within the angle of view of the camera 30 and the operator then selects the noise source monitoring mode in the smartphone SP, the camera 30 starts imaging. As a result, the camera 30 captures the operation state of the multiple levers 28 as a video (moving image). Then, the camera 30 sends data of the captured video, frame by frame, to the switching time recognition unit 34 via an unillustrated image input interface.

The operator OP checks the screen of the oscilloscope 26 while holding the noise source monitoring apparatus 10 as described above. When the operator determines that a radiation noise has occurred in the control device 22 (when it is determined that the voltage waveform displayed on the screen of the oscilloscope 26 is disturbed (for example, a high frequency radiation occurs on the voltage waveform), the operator taps the screen of the touch panel 33. At this time, the touch panel 33 generates a tap signal according to the tap and transmits the tap signal to the event time acquisition unit 36.

The event time acquisition unit 36 acquires the event time of a radiation noise generated in the control device 22 (hereinafter also referred to as "noise event time NT"). Specifically, the event time acquisition unit 36 acquires the time (the moment at which the screen of the touch panel 33 is tapped) of generation of the tap signal on the touch panel 33 as the noise event time NT, and sends the obtained result to the correlation calculation unit 38. The event time acquisition unit 36 also transmits an acquisition signal to the correlation calculation unit 38 every time the noise event time NT is acquired.

The switching time recognition unit 34 recognizes the on/off switching time ST of each of the multiple switch units 17 based on the image picked up by the camera 30. Specifically, the switching time recognition unit 34 compares data of the captured image for each frame from the camera 30, from one to the next, to thereby recognize the on/off switching time ST of each of the multiple switch units 17, and then sends the switching time ST of each switch unit 17 to the correlation calculation unit 38. Specifically, the switching time recognition unit 34 sends the switching time ST of each switch unit 17 and information indicative of the switch unit 17 to the correlation calculation unit 38.

The correlation calculation unit 38, based on the event time of radiation noise (noise event time NT) and the switching time ST of each of the multiple switch units 17, calculates the degree of correlation between the generation (occurrence) of a radiation noise and the on/off switching (switching) of each switch unit 17. Specifically, the correlation calculation unit 38 determines that a switch unit 17 that has been switched on/off (on or off) in a time period (predetermined time) TZ containing a noise event time NT has a correlation with the generation of the radiation noise, and calculates the degree of correlation such that the degree of correlation for a switch unit 17 is higher as the number of times the switch unit 17 has been determined to have correlation is greater. More detailedly, the correlation calculation unit 38 identifies the switch unit 17 that has switched within the time period TZ being centered at the noise event time NT. That is, the correlation calculation unit 38 identifies the switch unit 17 correlated with the occurrence of a radiation noise by determining the presence or absence of the operation of each switch unit 17 in the time period TZ, i.e., whether the switching operation was performed within the time period TZ for each switch unit. Then, based on the number of times of acquisition of noise event time NT by the event time acquisition unit 36 (the number of receptions of the acquisition signal) and the recognition result of the switching time recognition unit 34 for each noise event time NT (the presence or absence of the operation of each switch unit 17 for each noise event time NT), the correlation calculation unit 38 calculates the degree of correlation between the on/off switching of each switch unit 17 and the occurrence of radiation noise, and transmits the calculation result to the display control unit 40. Here, the center of the time period TZ does not necessarily have to coincide with the noise event time NT, and may be offset from the noise event time NT.

Of the first to fifth electric systems, an electrical system that corresponds to a switch unit 17 having a higher degree of correlation is more likely to be a generation source of radiation noise.

Next, a specific calculation method of the degree of correlation will be described.

Figure 3A:
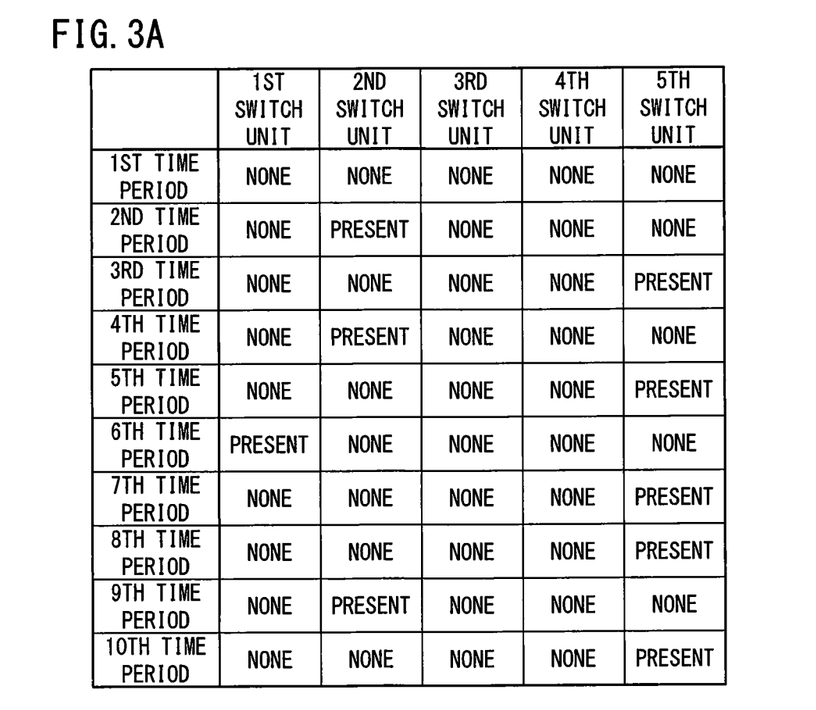
FIG. 3A is a table showing the presence or absence of operation of each switch unit at each noise event time.
Figure 3B:
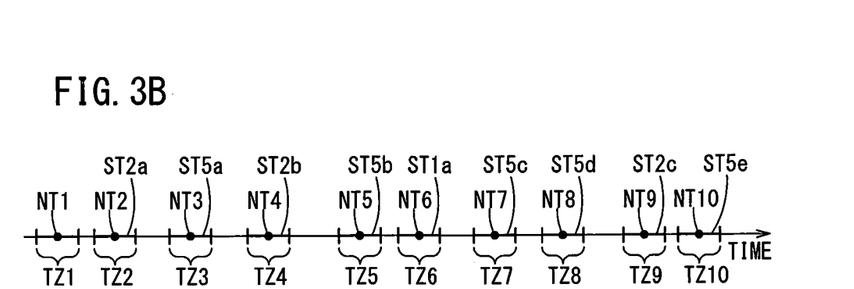
FIG. 3B is a diagram showing, on a time axis, ten noise event times, ten time periods, and ten switching events each for an n-th switch unit in a k-th time period.

As an example, FIG. 3A shows the presence or absence of the operation of the switch units 17 in each of the time periods TZ containing respective noise event times NT when the event time acquisition unit 36 acquires ten noise event times NT. FIG. 3B shows, on the time axis, the ten noise event times NT, the ten time periods TZ corresponding thereto, and switching times STni (i=a, b, c . . . ) each indicating a switching time of an n-th switch unit 17 in the k-th time period (k is at least one of 1 to 10). The ten time periods TZ include first time period TZ1, second time period TZ2, third time period TZ3, a fourth time period TZ4, fifth time period TZ5, sixth time period TZ6, seventh time period TZ7, eighth time period TZ8, ninth time period TZ9 and tenth time period TZ10. Here, the time lengths of the first time period TZ1 to the tenth time period TZ10 are constant (identical). The ten noise event times NT include noise event time NT1, noise event time NT2, noise event time NT3, noise event time NT4, noise event time NT5, noise event time NT6, noise event time NT7, noise event time NT8, noise event time NT9 and noise event time NT10.

As can be seen from FIG. 3B, the first time period TZ1 contains no switching times ST of the switch units 17. The second time period TZ2 contains a switching time ST2a of the second switch unit 17b. The third time period TZ3 contains a switching time ST5a of the fifth switch unit 17e. The fourth time period TZ4 contains a switching time ST2b of the second switch unit 17b. The fifth time period TZ5 contains a switching time ST5b of the fifth switch unit 17e. The sixth time period TZ6 contains a switching time ST1a of the first switch unit 17a. The seventh time period TZ7 contains a switching time ST5c of the fifth switch unit 17e. The eighth time period TZ8 contains a switching time ST5d of the fifth switch unit 17e. The ninth time period TZ9 contains a switching time ST2c of the second switch unit 17b. The tenth time period TZ10 contains a switching time ST5e of the fifth switch unit 17e.

In FIG. 3A, "present" indicates that the time period TZ contains a switching time ST of a switch unit 17, that is, "the switch unit 17 was operated (the switching event of the switch unit 17 occurred)", and "none" indicates that the time period TZ contains no switching time ST of a switch unit 17, that is, "the switch unit 17 was not operated (the switching event of the switch unit 17 did not occur)". From FIG. 3A, the ratio of the number of "present" to the number of time periods TZ (here, 10) for each switch unit 17 defines the "correlation degree (degree of correlation)". For example, the degree of correlation of the first switch unit 17a is $1/10$, the degree of correlation of the second switch unit 17b is $3/10$, the degree of correlation of the third switch unit 17c is 0, and the fourth switch unit 17d is 0, the fifth switch unit 17e is $1/2$. Hereinbelow, the total number of "present" in each switch unit 17 in FIG. 3A is also referred to as "noise-correlated operation count". At this time, the "noise-correlated operation count/the number of times of noise event time acquisition" for each switch unit 17 indicates the "degree of correlation" for each switch unit 17. The above calculation method of the degree of correlation is an example, and can be changed as appropriate.

The display control unit 40 causes the display 32 to display information indicative of the degree of correlation calculated by the correlation calculation unit 38. Specifically, the display control unit 40 causes the display 32 to display the multiple switch units 17 with at least one switch unit 17 colored. At this time, the display control unit 40 changes the color to be superimposed on the switch units 17 in accordance with the degree of correlation of each switch unit 17. For example, the display control unit 40 changes the color so that the switch unit 17 having a higher degree of correlation becomes more distinct (darker or gaudy, see the partially enlarged extracted view of the display 32 in FIG. 1). Here, "dark color" means "darker shade" in the same color. The "gaudy color" means vivid colors, regardless of same colors or different colors. For example, the display control unit 40 may superimpose similar colors (for example, dark red, light red, dark pink, light pink and the like) on the multiple switch units 17 in accordance with the degree of correlation. As another example, the display control unit 40 may superimpose different colors (for example, red, blue, yellow, green, black, etc.) having different hue on the multiple switch units 17 in accordance with the degree of correlation.

In the case of FIG. 3A and FIG. 3B, the fifth switch unit 17e having the highest degree of correlation is colored with the darkest, the second switch unit 17b having the second highest degree of correlation is colored with the second darkest, and the first switch unit 17a having the third highest degree of correlation is colored with the third darkest. Here, no colors are superimposed on the third switch unit 17c or the fourth switch unit 17d whose correlation degree is zero.

Figure 4:
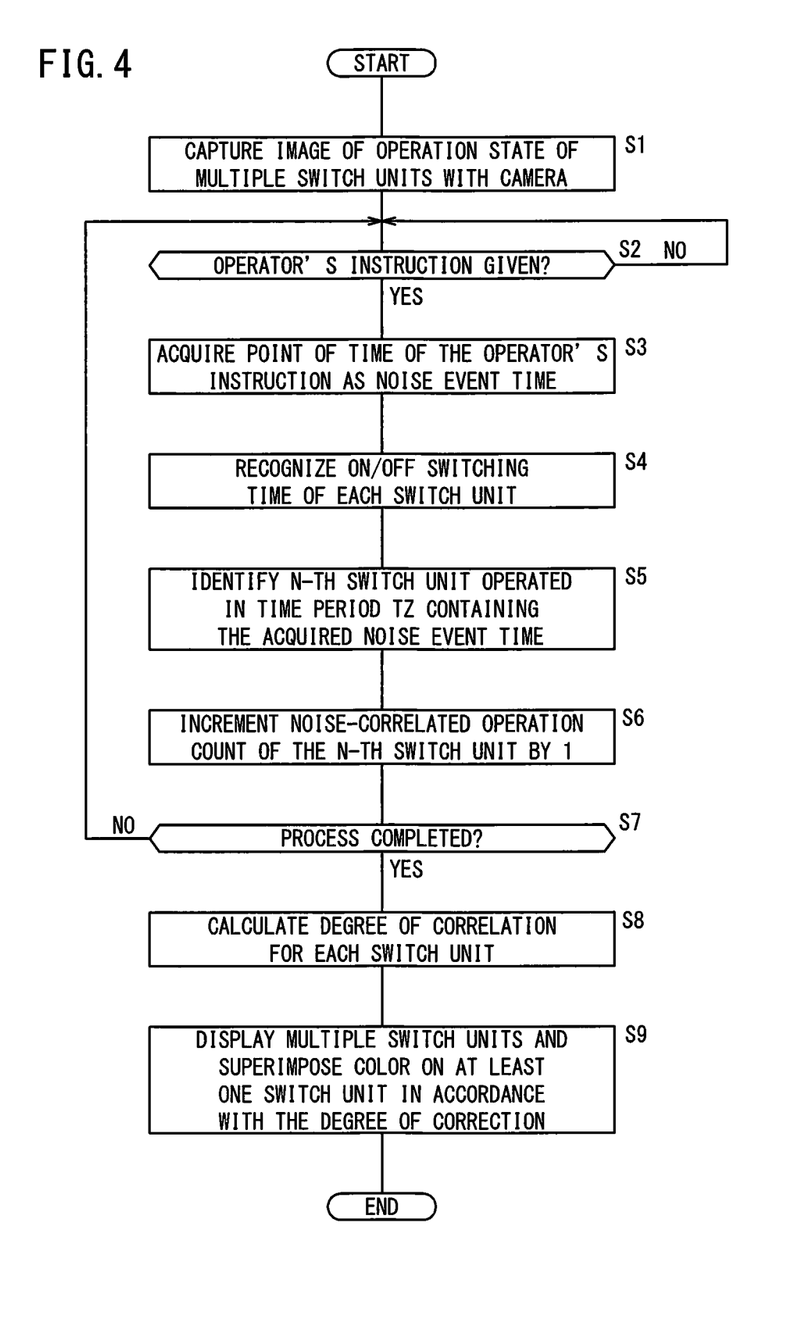
FIG. 4 is a flowchart showing a noise source monitoring process 1.

Referring next to the flowchart of FIG. 4, a noise source monitoring process 1 implemented by the noise source monitoring apparatus 10 thus configured will be described. Here, the noise source monitoring process 1 is started when the operator OP activates a "noise source monitoring mode 1" in the noise source monitoring apparatus 10 and is ended when the operator terminates the mode. The noise source monitoring process 1 may be automatically ended when a predetermined period of time has elapsed after the activation of the noise source monitoring mode 1 by the operator OP, or may be ended when the noise source monitoring apparatus 10 has remained in such a posture or in such a position that the multiple switch units 17 fall outside the angle of view (photographing field of view) of the camera 30 for a predetermined period of time or more.

At the first step S1, the camera 30 captures an image of the operation state of the multiple switch units 17. Specifically, the operator OP selects the "noise source monitoring mode 1" in the noise source monitoring apparatus 10 while holding the apparatus 10 so that the camera 30 can capture an image of the operation state of the multiple switch units 17. As the noise source monitoring mode 1 is activated, the camera 30 starts capturing the image.

At the next step S2, the event time acquisition unit 36 determines whether or not the operator OP has issued an instruction. Specifically, the event time acquisition unit 36 determines whether or not the operator OP has tapped the screen of the noise source monitoring apparatus 10 (the screen of the smartphone SP). The operator OP watches the screen of the oscilloscope 26, and touches the touch panel 33 when having determined that a radiation noise has occurred. At this time, the touch panel 33 generates a tap signal and sends it to the event time acquisition unit 36. The event time acquisition unit 36 determines that the screen of the smartphone SP has been tapped, when it has received the tap signal from the touch panel 33. If the determination at step S2 is affirmed, the process proceeds to step S3. If the determination at step S2 is denied, the same determination is continued (i.e., stays in a waiting mode).

At step S3, the event time acquisition unit 36 acquires the time at which the operator OP issued the instruction (the time when tap signal was generated by the touch panel 33) at step S2, as a point of time (noise event time NT) at which a radiation noise occurred in the control device 22. The event time acquisition unit 36 sends the acquired noise event time NT to the correlation calculation unit 38.

At the next step S4, the switching time recognition unit 34 recognizes the on/off switching time ST of each switch unit 17, and sends the switching time ST to the correlation calculation unit 38.

At the next step S5, the correlation calculation unit 38 identifies the n-th switch unit 17 (n=1 to 5) that has operated in the time period TZ containing the acquired noise event time NT.

At the next step S6, the correlation calculation unit 38 increments the noise-correlated operation count of the n-th switch unit 17 by +1. Incidentally, the initial value of the noise-correlated operation count is zero.

At the next step S7, the correlation calculation unit 38 determines whether to complete the process. The determination here is affirmed when the operator OP performs a procedure (operation) for ending the "noise source monitoring mode 1" in the noise source monitoring apparatus 10. When it is determined that the process is to be ended, the correlation calculation unit 38 initializes the noise-correlated operation count (sets to 0). If the determination at step S7 is affirmed, the process proceeds to step S8. When the determination at step S7 is negative, the process returns to step S2.

At step S8, the correlation calculation unit 38 calculates the degree of correlation for every switch unit 17. Specifically, the correlation calculation unit 38 calculates the ratio of the noise-correlated operation count to the number of times of acquisition of the noise event time NT for each switch unit 17 as the degree of correlation of the switch unit 17.

At step S9, the display control unit 40 causes the display 32 to display the multiple switch units 17 while superimposing a color on at least one switch unit 17 in accordance with the degree of correlation. Specifically, the display control unit 40 superimposes darker or more gaudy colors on the switch units 17 having higher degrees of correlation. When step S9 is performed, the operation flow is ended.

MODIFICATIONS

The configuration of the noise source monitoring apparatus 10 described in the above embodiment can be changed as appropriate.

Modification 1

Figure 5:
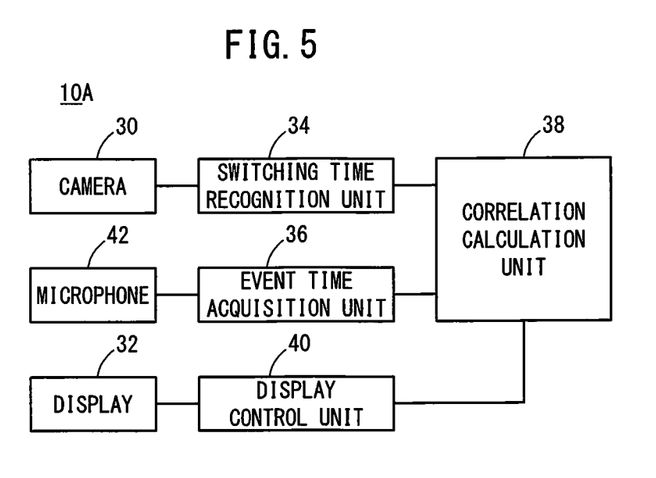
FIG. 5 is a control block diagram of a noise source monitoring apparatus according to Modification 1.

In the above embodiment, the touch panel 33 is used as an input unit for the operator OP to input (indicate) occurrence of radiation noise, but the present invention is not limited to this. For example, as in a noise source monitoring apparatus 10A of Modification 1 shown in FIG. 5, a microphone 42 may be used. Specifically, the operator OP, who holds the noise source monitoring apparatus 10A (smart phone SP) so that the camera 30 can take the image of multiple switch units 17, watches the screen of the oscilloscope 26, and gives a sound by clapping hands, or gives voice when the operator recognizes occurrence of a radiation noise. At this time, the sound (including voice) is input to the microphone 42, and converted into a signal, and then the signal is sent to the event time acquisition unit 36 via a sound input interface (not shown). The subsequent processing is the same as that of the above embodiment. The microphone 42 can be, for example, one provided as the standard equipment of the smartphone SP.

Modification 2

Figure 6:
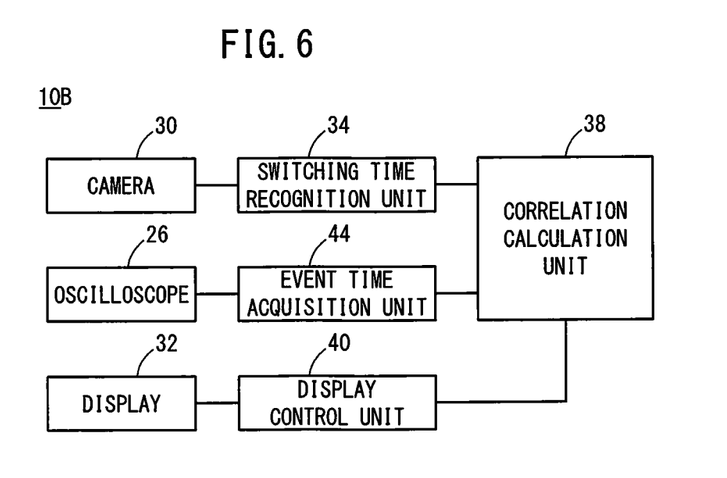
FIG. 6 is a control block diagram of a noise source monitoring apparatus according to Modification 2.

In the above embodiment and Modification 1, when the operator OP watches the screen of the oscilloscope 26 and determines that a radiation noise has occurred, the operator OP causes the input unit to generate a signal and send the signal to the event time acquisition unit 36. However, the present invention is not limited to this. For example, in a noise source monitoring apparatus 10B of Modification 2 shown in FIG. 6, the oscilloscope 26 that detects the voltage waveform of the control signal is connected to an event time acquisition unit 44, so as to output the voltage waveform to the event time acquisition unit 44. The event time acquisition unit 44 analyzes the voltage waveform output from the oscilloscope 26, and determines whether a radiation noise has occurred. When it is determined that a radiation noise has occurred (when the voltage waveform has been disturbed), the event time acquisition unit 44 acquires the time of the determination as a noise event time NT.

Figure 7:
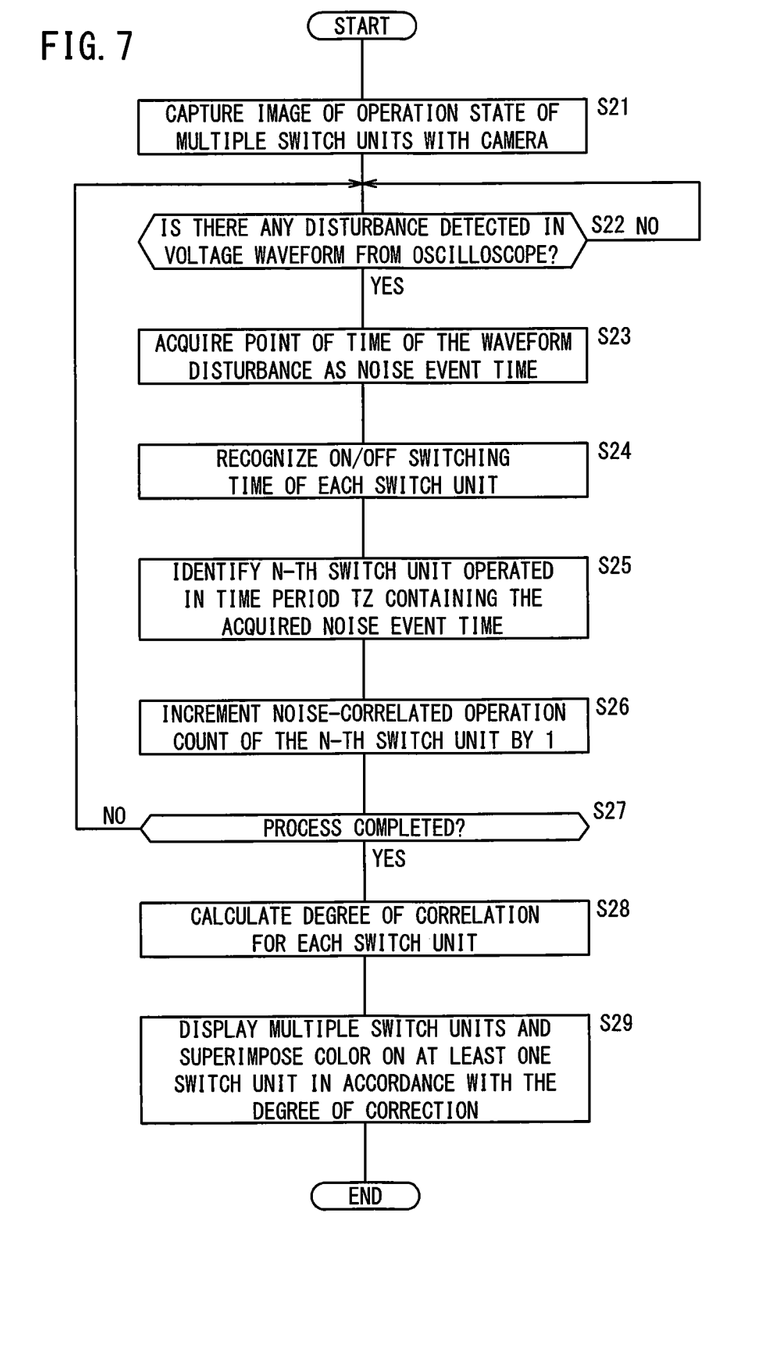
FIG. 7 is a flowchart showing a noise source monitoring process 2.

A noise source monitoring process 2 implemented by the noise source monitoring apparatus 10B will be described with reference to the flowchart of FIG. 7. The noise source monitoring process 2 is started when the operator OP activates a "noise source monitoring mode 2" in the noise source monitoring apparatus 10B. Steps S21, S24, S25, S26, S27, S28 and S29 in FIG. 7 are respectively the same as steps S1, S4, S5, S6, S7, S8 and S9 in FIG. 4, so that only steps S22 and S23 will be described.

At step S22, the event time acquisition unit 44 determines whether or not disturbance has occurred in the voltage waveform of the control signal from the oscilloscope 26. If the determination at step S22 is affirmed, the process proceeds to step S23. If the determination at step S22 is negative, the same determination is continued again.

At step S23, the event time acquisition unit 44 acquires, as the noise event time NT, the point of time at which a disturbance occurred in the voltage waveform, and sends the obtained result to the correlation calculation unit 38.

The configuration of the switchboard 16 in the above-described embodiment and each of Modifications can be changed as appropriate.

Modification 3

Figure 8:
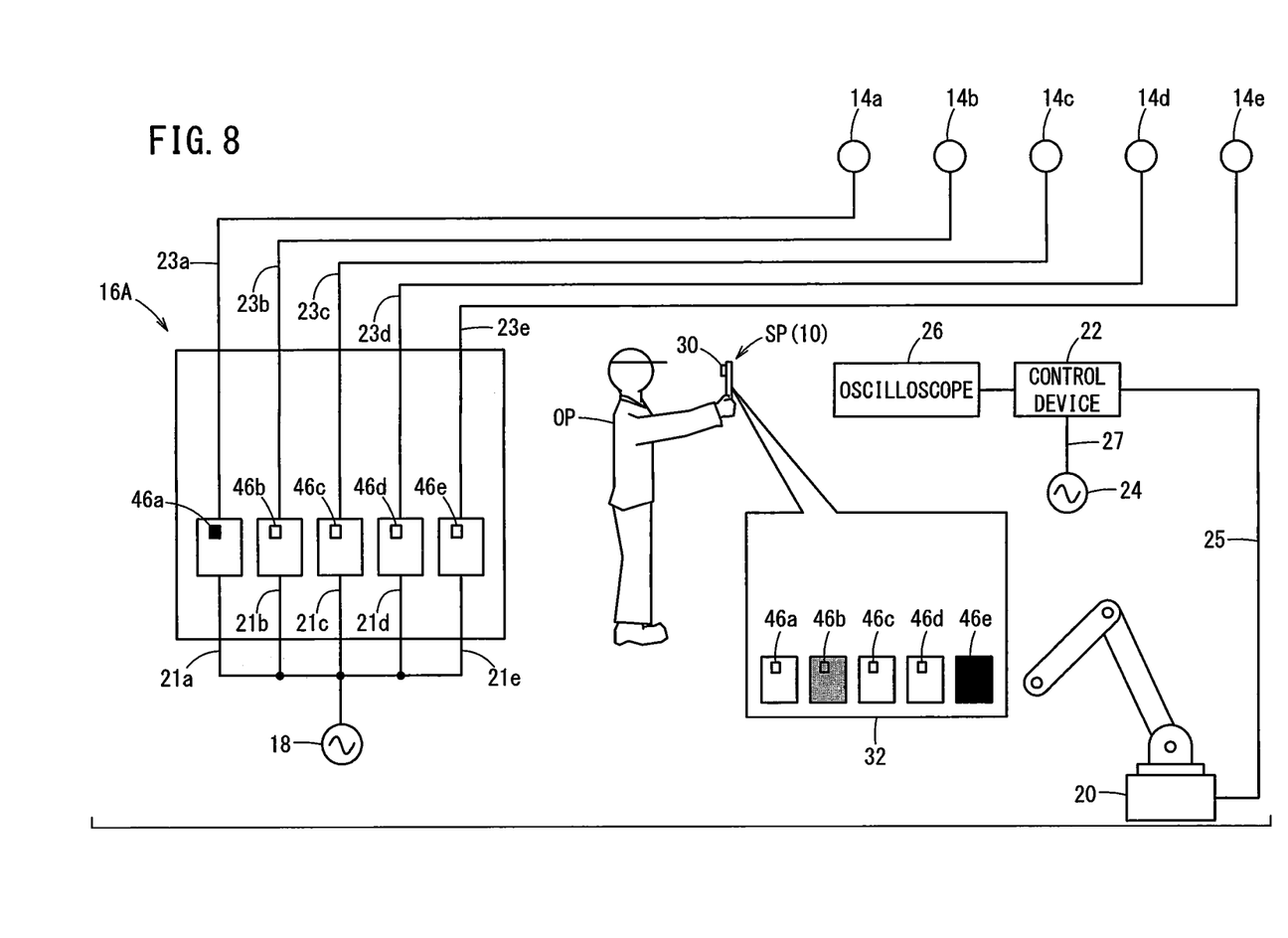
FIG. 8 is a diagram showing a configuration example of a switchboard of Modification 3.

As in a switchboard 16A in Modification 3 shown in FIG. 8, instead of the multiple (e.g., five) levers 28, multiple (e.g., five) light sources 46 (a first light source 46a for the first switch unit, a second light source 46b for the second switch unit, a third light source 46c for the third switch unit, a fourth light source 46d for the fourth switch unit, a fifth light source 46e for the fifth switch unit) which switch between an ON state and an OFF state in accordance with the on/off state of the associated switch, may be used. Here, when a switch unit is on, the light source 46 corresponding to the switch unit is lit (the lit light source 46 is illustrated with an outline (white) on the switchboard 16A in FIG. 8), whereas when a switch unit is off, the light source 46 corresponding to the switch unit is turned off (the turned-off light source 46 is illustrated with a solid (black) on the switchboard 16A in FIG. 8). In this case, the switching time recognition unit 34 analyzes the image captured by the camera 30, and recognizes the on/off switching time ST of each light source 46 to determine the switching time ST of the switch unit containing the light source 46. The display control unit 40 displays the captured image of the multiple (for example, five) light sources 46 and superimposes a color on at least one of the switch units. Specifically, for example, the display control unit 40 superimposes the most distinct color (the darkest color or the gaudiest color) on the fifth switch unit having the highest degree of correlation, superimposes the second-most distinct color (the second darkest or the second gaudiest) on the second switch unit having the second highest degree of correlation, and superimposes the third-most distinct color (the third darkest or the third gaudiest) on the first switch unit having the third highest degree of correlation (see the partially enlarged extracted view of the display 32 in FIG. 8). The display control unit 40 does not superimpose colors on the third switch unit or the fourth switch unit whose correlation degree is zero. For each light source 46, an LED (light emitting diode) may be used, for example.

Modification 4

In the switchboard, a plurality of sets (for example, 5 sets) of levers 28 and light sources may be used, wherein in each set, the lever and the light source are simultaneously switched on/off in synchronization with the on/off switching of the corresponding switch. Specifically, when a switch is on, the lever 28 corresponding to the switch is turned on, and the light source corresponding to the switch is lit, and when a switch is off, the lever 28 corresponding to the switch is turned off, and the light source corresponding to the switch is turned off. The display control unit 40 displays the captured image of the multiple (e.g., five) levers 28 and the multiple (e.g., five) light sources, and superimposes a color on at least one of the switch units. The color superimposing method is the same as that of the above embodiment and Modifications. For example, an LED (light emitting diode) may be used as the light source.

Modification 5

It goes without saying that the number of switch units 17 in the switchboard 16 can be changed as appropriate according to the number of drive units 14 used.

Modification 6

In the above embodiment and Modifications, the noise source monitoring apparatuses 10, 10A and 10B are realized by a smart phone SP, but it may be realized by a tablet terminal with a camera.

Modification 7

Although the robot 20 is used as an industrial machine in the above embodiment and Modifications, the present invention should not be limited to this. For example, any other industrial machines, such as a cutting machine, a press machine, a wire electrical discharge machine, an injection molding machine, a machine tool that machines a workpiece using a tool, and the like may be used as long as they are an industrial machine controlled by the control device 22.

Modification 8

In the above embodiment and Modifications, the display control unit 40 does not superimpose colors on switch units 17 corresponding to switches with a correlation degree of 0, but may superimpose an inconspicuous color (for example, white) thereon.

Modification 9

Although, in the above embodiment and Modifications, multiple colors (including achromatic colors) are used as the information indicating the degree of correlation, the present invention should not be limited to this. As information indicating the degree of correlation, for example, multiple words such as "highest", "high", "medium", "low", and "lowest", multiple figures such as "1", "2", "3", "4", and "5", or multiple letters such as "A", "B", "C", "D" and "E" may be used. Further, the information indicating the degree of correlation may be the numerical value itself.

Modification 10

In the above embodiment and Modifications, at least one of the lever 28 and the light source 46 which are switched on/off in conjunction with the operation of the switch is used. However, for example, it is possible to use a button that moves between a projected position and a non-projected position (e.g., a retracted position). In this case, it is necessary to take the image with the camera 30 from one side (for example, the upper side, the lower side, the right side, the left side, etc. of the button) that makes it possible to determine the distinguish between the projected position and the non-projected position of the button. In this case, the switching time recognition unit 34 analyzes the image captured by the camera 30, and recognizes the switching time ST of projection/non-projection of each button to thereby determine the switching time ST of the switch unit containing the button.

Modification 11

In the above embodiment and Modifications, the correlation calculation unit 38 calculates the degrees of correlation for all the radiation noises generated in the control device 22. However, the degree of correlation of radiation noises generated in the control device 22 may be calculated only for the radiation noises that exceed a threshold. In this case, radiation noises that do not affect the control signal can be excluded from the calculation target of the degree of correlation. Furthermore, a plurality of thresholds may be set so as to allow the operator (OP) to optionally select one from the multiple thresholds. In this case, the operator (OP) can phase out radiation noises that will not affect the control signal, depending on the situation.

Modification 12

In the above embodiment and Modifications, the control signal is observed by using the oscilloscope 26, and the event time acquisition unit 36 or 44 acquires the time point at which a disturbance occurs in the control signal, as the noise event time NT. But, the invention should not be limited to this. For example, the reference potential of the control device 22 may be observed by using the oscilloscope 26, and the event time acquisition unit 36 or 44 may acquire the time point at which a disturbance occurs in the reference potential, as the noise event time NT.

Modification 13

In the above embodiment and Modifications, the correlation calculation unit 38 performs calculation such that, as the ratio of the number of times a switch unit has been determined to have a correlation with occurrence of radiation noise (hereinafter also called as "the number of correlation judgments") to the number of times of occurrence of radiation noise becomes greater, the degree of correlation for the switch unit becomes higher. However, the present invention should not be limited to this. For example, the correlation calculation unit 38 may perform calculation such that, as the ratio of the number of correlation judgments for a switch unit to the number of operations (the number of operations during the noise source monitoring process 1 or 2) is greater, the degree of correlation for the switch unit is higher. In this case, the switching time recognition unit 34 needs to count the number of operations (the number of switching times) of each switch unit and send the count to the correlation calculation unit 38. In the above embodiment and Modifications, if there are multiple switch units having the same number of correlation judgments but having different numbers of operations from each other, the correlation degrees of the multiple switch units take the same value. For example, suppose that there occurred radiation noise five times and that the switch unit A was operated 10 times and had one correlation judgment while the switch unit B was operated 20 times and had one correlation judgment. In this case, the degrees of correlation for the switch units A and B both result in $1/5$. However, in this Modification, because the degree of correlation is defined as the number of correlation judgments/the number of operations, the degree of correlation for the switch unit A results in $1/10$, whereas the degree of correlation for the switch unit B results in $1/20$. That is, in this Modification, the number of operations can be reflected on the degree of correlation.

Modification 14

In the above embodiment and Modifications, each drive unit 14 and the first power supply 18 are appropriately connected via a switch unit associated to the drive unit 14. However, each drive unit 14 and an element or a group of elements connected to the first power supply 18 may be appropriately connected via a switch unit associated to the drive unit 14.

Modification 15

In the above embodiment and Modifications, the correlation calculation unit 38 determines whether or not a switching time ST is contained in each of multiple time periods TZ containing respective different noise event times NT. However, the invention should not be limited to this. The point is that the correlation calculation unit 38 may detect a pair of a noise event time NT and a switching time ST of a switch unit within a predetermined time range. For example, the pair may be detected by determining whether or not a noise event time NT is contained in each of multiple predetermined time periods TZ containing respective different switching times ST of switch units.

Modification 16

Figure 9:
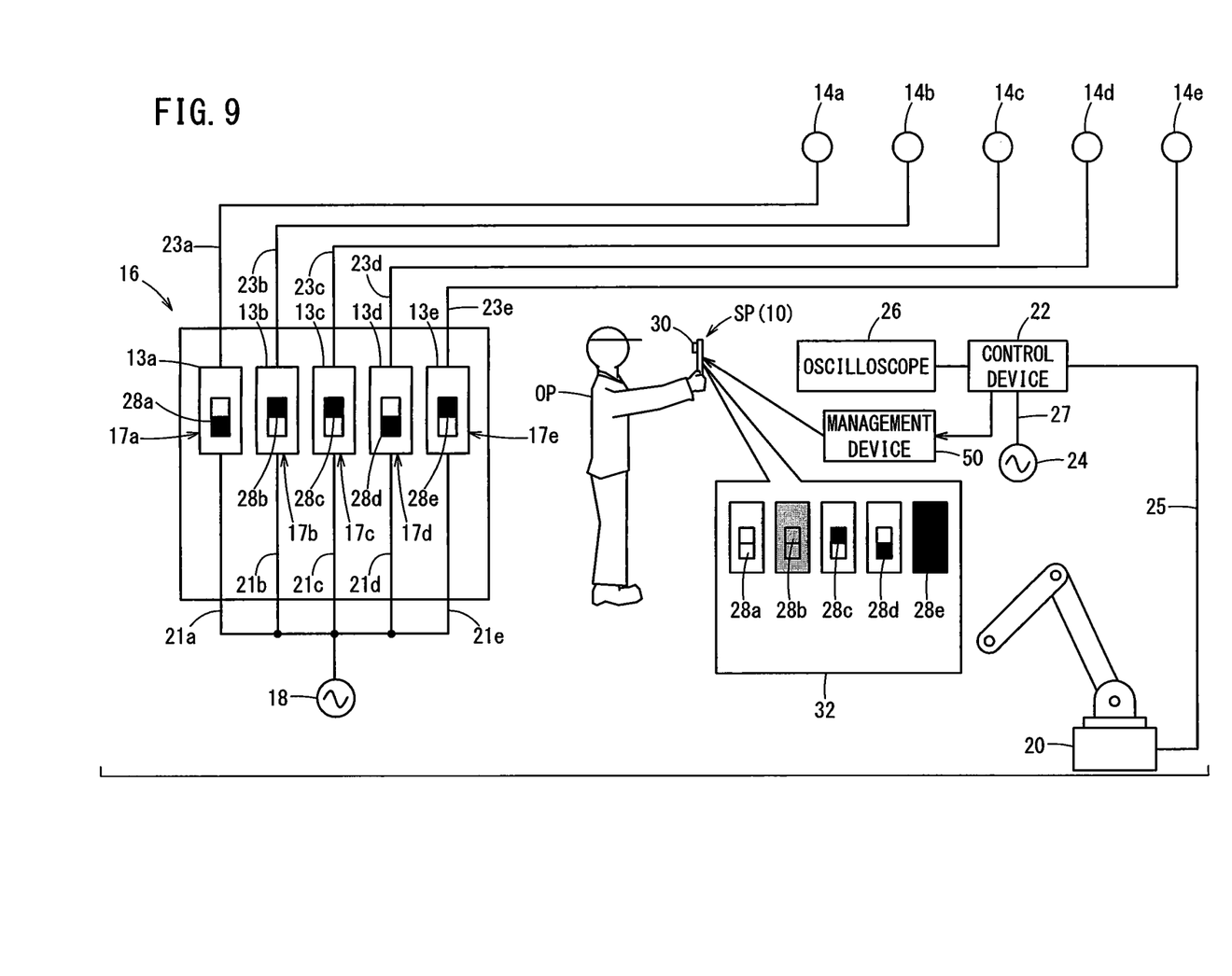
FIG. 9 is a diagram showing a schematic configuration of a noise source monitoring apparatus and others according to Modification 16.

Though, in the above embodiment and Modifications, the noise source is assumed to be other than the robot 20, the operation of the robot 20 may sometimes become a noise source on the control signal of the robot 20. FIG. 9 is a diagram showing a schematic configuration of a noise source monitoring apparatus 10 according to Modification 16. In FIG. 9, a management device 50 is added to the configuration of FIG. 1. The management device 50 is a device capable of data communication, such as a personal computer. The management device 50 can communicate with the noise source monitoring apparatus 10 and the control device 22. The noise source monitoring apparatus 10 acquires operation information of the robot 20 from the control device 22 via the management device 50. The operation information of the robot 20 is time-sequential data representing what kind of motion the robot 20 is making. Specific examples of the operation information of the robot 20 include the positions of all the movable joints that specify the posture and position of the robot 20 at each point of time, the execution portions in the control program of the robot 20 executed by the control device 22 at each point of time, and others. The correlation calculation unit 38 of the noise source monitoring apparatus 10, based on the event time of a radiation noise (noise event time NT) and the operation information of the robot 20, calculates a degree of correlation between the event of the radiation noise and the operation of the robot 20. The display control unit 40 causes the display 32 to display the information representing the calculated degree of correlation on a screen (not shown) following the screen displayed in FIG. 9.

Modification 17

Modifications 1 to 16 may be arbitrarily combined as long as no technical inconsistency occurs.
[Inventions that can be Grasped from the Embodiment and Modifications 1 to 17]
[First Invention]
The first aspect of the invention resides in the noise source monitoring apparatus (10) including: an imaging unit (30) configured to capture an image of a plurality of switch units (17) configured to switch on and off drive units (14) for driving a plurality of devices, the drive units being arranged around a control device (22) for controlling an industrial machine (20), the plurality of devices being different from the industrial machine (20); an event time acquisition unit (36) configured to acquire a noise event time of a noise occurring in the control device (22); a switching time recognition unit (34) configured to recognize an on/off switching time (ST) of each of the plurality of switch units (17), based on the image captured by the imaging unit (30); a correlation calculation unit (38) configured to calculate, for each of the switch units (17), the degree of correlation between occurrence of the noise and the on/off switching of the switch unit (17), based on the noise event time and the on/off switching time (ST) of each of the plurality of switch units (17); and a display control unit (40) configured to cause a display unit (32) to display information indicating the degree of correlation for each of the switch units (17).

As a result, information indicating the degree of correlation between the generation of noise and the on/off switching of each switch unit (17) is displayed on the display unit (32).

That is, according to the first invention, it is possible to provide the operator (OP) with information for estimating the noise source of noise generated in the control device (22) that controls the industrial machine (20).

The correlation calculation unit (38) may be configured to determine that the switch unit (17) that has been switched on/off in a predetermined time (TZ) containing the noise event time has correlation with the occurrence of the noise, and calculate the degrees of correlation for each of the multiple switch units (17) such that, as the number of times a switch unit (17) has been determined to have the correlation becomes greater, the degree of correlation for the switch unit (17) becomes higher. As a result, even if there is a time lag between the point of time at which the noise event time is acquired and the point of time at which a switch unit (17) is switched on/off, it is possible to prevent occurrence of misjudgment that there is no correlation between the switch unit (17) and the occurrence of the noise.

The correlation calculation unit (38) may be configured to calculate the degree of correlation such that, as the number of times a switch unit (17) has been determined to have the correlation becomes greater, the degree of correlation for the switch unit (17) becomes higher. This enables the correlation calculation unit (38) to easily calculate the relative degrees of correlation of the multiple switch units (17).

The correlation calculation unit (38) may be configured to calculate the degree of correlation such that, as the ratio of the number of times a switch unit (17) has been determined to have the correlation to the number of operations of the switch unit becomes greater, the degree of correlation for the switch unit (17) becomes higher. This enables the correlation calculation unit (38) to reflect the number of operations of each switch unit (17) on the degree of correlation of the switch unit (17).

An oscilloscope (26) connected to the control device (22) may be connected to the noise source monitoring apparatus (10), and the event time acquisition unit (36) may analyze a waveform detected by the oscilloscope (26) and acquire the noise event time. Thereby, the operator (OP) does not have to monitor the screen of the oscilloscope (26), and also does not have to input the noise event time (i.e., point of time of noise generation).

The event time acquisition unit (36) may be configured to acquire the time instructed by an operator (OP) as the noise event time. This makes it unnecessary to connect the oscilloscope (26) to the noise source monitoring apparatus (10) and makes it possible to reduce the processing load on the noise source monitoring apparatus (10).

The correlation calculation unit (38) may be configured to calculate the degree of correlation only for noises that exceed a threshold, among the noises. This makes it possible to exclude from the targets of correlation calculation those noises that do not affect the control of the industrial machine (20) by the control device (22).

The display control unit (40) may be configured to display the image captured by the imaging unit (30) and superimpose information indicating the degree of correlation, on at least one of the switch units (17) in the image. Thereby, the operator (OP) can easily recognize the degree of correlation for each switch unit (17) by viewing the displayed image.

The information indicating the degree of correlation may be color while the display control unit (40) may be configured to change the color depending on the degree of correlation. Owing thereto, it is possible to clearly recognize the level of the degree of correlation for each switch unit (17).

[Second Invention]

The second aspect of the invention resides in a noise source monitoring method, including: an imaging step of capturing an image of a plurality of switch units (17) configured to switch on and off drive units (14) for driving a plurality of devices, the drive units being arranged around a control device (22) for controlling an industrial machine (20), the plurality of devices being different from the industrial machine (20); an event time acquiring step of acquiring a noise event time of a noise occurring in the control device (22); a switching time recognizing step of recognizing an on/off switching time (ST) of each of the plurality of switch units (17), based on the image captured at the imaging step; a correlation calculating step of calculating, for each of the switch units (17), a degree of correlation between occurrence of the noise and on/off switching of the switch unit (17), based on the noise event time and the on/off switching time (ST) of each of the plurality of switch units (17); and a display controlling step of causing a display unit (32) to display information indicating the degree of correlation for each of the switch units (17).

As a result, information indicating the degree of correlation between the generation of noise and the on/off switching of each switch unit (17) is displayed on the display unit (32).

That is, according to the second invention, it is possible to provide the operator (OP) with information for estimating the noise source of noise generated in the control device (22) that controls the industrial machine (20).

The correlation calculating step may determine that the switch unit (17) that has been switched on/off in a predetermined time (TZ) containing the noise event time has correlation with the occurrence of the noise, and calculate the degree of correlation for each of the multiple switch units (17) such that, as the number of times a switch unit (17) has been determined to have the correlation becomes greater, the degree of correlation for the switch unit (17) becomes higher. As a result, even if there is a time lag between the point of time at which the noise event time is acquired and the point of time at which a switch unit (17) is switched on/off, it is possible to prevent occurrence of misjudgment that there is no correlation between the switch unit (17) and the occurrence of the noise.

The correlation calculating step may calculate the degree of correlation such that, as the number of times a switch unit (17) has been determined to have the correlation becomes greater, the degree of correlation for the switch unit (17) becomes higher. Thereby, in the correlation calculating step, the relative correlation degrees of the multiple switch units (17) can be calculated.

The correlation calculating step may calculate the degree of correlation such that, as the ratio of the number of times a switch unit (17) has been determined to have the correlation to the number of operations of the switch unit becomes greater, the degree of correlation for the switch unit (17) becomes higher. Thus, in the correlation calculating step, the number of operations of each switch unit (17) can be reflected on the degree of correlation of the switch unit (17).

The display controlling step may be configured to display the image captured at the imaging step and superimpose information indicating the degree of correlation, on at least one of the switch units (17) in the image. Thereby, the operator (OP) can easily recognize the degree of correlation for each switch unit (17) by viewing the displayed image.

The information indicating the degree of correlation may be represented by a color, and the display controlling step may change the color in accordance with the degree of correlation. Owing to this, it is possible to clearly recognize the level of the degree of correlation for each switch unit (17).

The present invention is not particularly limited to the embodiment described above, and various modifications are possible without departing from the essence and gist of the present invention.

What is claimed is:

1. A noise source monitoring apparatus, comprising:
an imaging unit configured to capture an image of a plurality of switch units configured to switch on and off drive units for driving a plurality of devices, the drive units being arranged around a control device for controlling an industrial machine, the plurality of devices being different from the industrial machine;
an event time acquisition unit configured to acquire a noise event time of a noise occurring in the control device;
a switching time recognition unit configured to recognize an on/off switching time of each of the plurality of switch units, based on the image captured by the imaging unit;
a correlation calculation unit configured to calculate, for each of the switch units, a degree of correlation between occurrence of the noise and on/off switching of the switch unit, based on the noise event time and the on/off switching time of each of the plurality of switch units; and
a display control unit configured to cause a display unit to display information indicating the degree of correlation for each of the switch units.

2. The noise source monitoring apparatus according to claim 1, wherein the correlation calculation unit is configured to determine that the switch unit that has been switched on/off in a predetermined time containing the noise event time has correlation with the occurrence of the noise, and calculate the degree of correlation for each of the switch units so that, as number of times the switch unit has been determined to have the correlation becomes greater, the degree of correlation for the switch unit becomes higher.

3. The noise source monitoring apparatus according to claim 2, wherein the correlation calculation unit is configured to calculate the degree of correlation so that, as the number of times the switch unit has been determined to have the correlation becomes greater, the degree of correlation for the switch unit becomes higher.

4. The noise source monitoring apparatus according to claim 2, wherein the correlation calculation unit is configured to calculate the degree of correlation so that, as a ratio of the number of times the switch unit has been determined to have the correlation to number of operations of the switch unit becomes greater, the degree of correlation for the switch unit becomes higher.

5. The noise source monitoring apparatus according to claim 1, wherein:
an oscilloscope connected to the control device is connected to the noise source monitoring apparatus; and
the event time acquisition unit is configured to analyze a waveform detected by the oscilloscope and acquire the noise event time.

6. The noise source monitoring apparatus according to claim 1, wherein the event time acquisition unit is configured to acquire a time instructed by an operator as the noise event time.

7. The noise source monitoring apparatus according to claim 1, wherein the correlation calculation unit is configured to calculate the degree of correlation only for noises that exceed a threshold, among the noises.

8. The noise source monitoring apparatus according to claim 1, wherein the display control unit is configured to display the image captured by the imaging unit and superimpose information indicating the degree of correlation, on at least one of the switch units in the image.

9. The noise source monitoring apparatus according to claim 8, wherein:
the information indicating the degree of correlation is represented by a color; and
the display control unit is configured to change the color in accordance with the degree of correlation.

10. A noise source monitoring method, comprising:
an imaging step of capturing an image of a plurality of switch units configured to switch on and off drive units for driving a plurality of devices, the drive units being arranged around a control device for controlling an industrial machine, the plurality of devices being different from the industrial machine;
an event time acquiring step of acquiring a noise event time of a noise occurring in the control device;
a switching time recognizing step of recognizing an on/off switching time of each of the plurality of switch units, based on the image captured at the imaging step;
a correlation calculating step of calculating, for each of the switch units, a degree of correlation between occurrence of the noise and on/off switching of the switch unit, based on the noise event time and the on/off switching time of each of the plurality of switch units; and
a display controlling step of causing a display unit to display information indicating the degree of correlation for each of the switch units.

11. The noise source monitoring method according to claim 10, wherein the correlation calculating step determines that the switch unit that has been switched on/off in a predetermined time containing the noise event time has correlation with the occurrence of the noise, and calculates the degree of correlation for each of the switch units so that, as number of times the switch unit has been determined to have the correlation becomes greater, the degree of correlation for the switch unit becomes higher.

12. The noise source monitoring method according to claim 11, wherein the correlation calculating step calculates the degree of correlation so that, as the number of times the switch unit has been determined to have the correlation becomes greater, the degree of correlation for the switch unit becomes higher.

13. The noise source monitoring method according to claim 11, wherein the correlation calculating step calculates the degree of correlation so that, as a ratio of the number of times the switch unit has been determined to have the correlation to number of operations of the switch unit becomes greater, the degree of correlation for the switch unit becomes higher.

14. The noise source monitoring method according to claim 10, wherein the display controlling step displays the image captured at the imaging step and superimpose information indicating the degree of correlation, on at least one of the switch units in the image.

15. The noise source monitoring method according to claim 14, wherein:
- the information indicating the degree of correlation is represented by a color; and
- the display controlling step changes the color in accordance with the degree of correlation.

16. A noise source monitoring apparatus, comprising:
- an imaging unit configured to capture an image of a plurality of electrical switches configured to switch on and off motors configured to drive a plurality of devices, the motors being arranged around a controller configured to control an industrial machine, the plurality of devices being different from the industrial machine; and
- a processor configured to:
  - acquire a noise event time of a noise occurring in the controller;
  - recognize an on/off switching time of each of the plurality of switches, based on the image captured by the imaging unit;
  - calculate, for each of the switches, a degree of correlation between occurrence of the noise and on/off switching of the switches, based on the noise event time and the on/off switching time of each of the plurality of switches; and
  - cause a display to display information indicating the degree of correlation for each of the switches.

* * * * *